(12) United States Patent
Zhao

(10) Patent No.: US 10,418,461 B2
(45) Date of Patent: Sep. 17, 2019

(54) SEMICONDUCTOR STRUCTURE WITH BARRIER LAYERS

(71) Applicants: Semiconductor Manufacturing International (Shanghai) Corporation, Shanghai (CN); Semiconductor Manufacturing International (Beijing) Corporation, Beijing (CN)

(72) Inventor: Meng Zhao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/218,748

(22) Filed: Dec. 13, 2018

(65) Prior Publication Data

US 2019/0115450 A1    Apr. 18, 2019

Related U.S. Application Data

(62) Division of application No. 15/862,569, filed on Jan. 4, 2018, now Pat. No. 10,186,598.

(30) Foreign Application Priority Data

Jan. 6, 2017    (CN) .......................... 2017 1 0011110

(51) Int. Cl.
*H01L 29/66*    (2006.01)
*H01L 21/04*    (2006.01)
(Continued)

(52) U.S. Cl.
CPC .. *H01L 29/66545* (2013.01); *H01L 21/02164* (2013.01); *H01L 21/047* (2013.01);
(Continued)

(58) Field of Classification Search
CPC .......... H01L 29/66545; H01L 29/1045; H01L 29/6656; H01L 29/66636; H01L 29/66659;
(Continued)

(56) References Cited

U.S. PATENT DOCUMENTS

| 5,757,045 A * | 5/1998 | Tsai ................. H01L 21/82380 257/336 |
| 2014/0319625 A1 | 10/2014 | Zhao |
| 2015/0228777 A1 * | 8/2015 | Zhang ............... H01L 29/66545 257/347 |

* cited by examiner

*Primary Examiner* — Selim U Ahmed
(74) *Attorney, Agent, or Firm* — Anova Law Group, PLLC

(57) ABSTRACT

Semiconductor structures and fabrication methods thereof are provided. An exemplary fabrication method includes providing a base substrate; forming a dummy gate structure over the base substrate; forming source/drain regions having source/drain doping ions in the base substrate at both sides of the dummy gate structure; forming a dielectric layer on the source/drain regions and covering the side surfaces of the dummy gate structure; removing the dummy gate structure to form an opening in the dielectric layer; performing one or more of a first ion implantation process, for implanting first barrier ions in the base substrate toward the source region to form a first barrier layer under the opening, and a second ion implantation process, for implanting second barrier ions in the base substrate toward the source region to form a second barrier layer under the opening; and forming a gate structure in the opening.

20 Claims, 5 Drawing Sheets

(51) Int. Cl.
*H01L 21/768* (2006.01)
*H01L 21/02* (2006.01)
*H01L 29/78* (2006.01)
*H01L 29/10* (2006.01)
*H01L 29/165* (2006.01)
*H01L 21/265* (2006.01)

(52) U.S. Cl.
CPC .... *H01L 21/76802* (2013.01); *H01L 29/1045* (2013.01); *H01L 29/6656* (2013.01); *H01L 29/66492* (2013.01); *H01L 29/66636* (2013.01); *H01L 29/66659* (2013.01); *H01L 29/785* (2013.01); *H01L 29/7848* (2013.01); H01L 21/26506 (2013.01); H01L 21/26513 (2013.01); H01L 21/26586 (2013.01); H01L 29/165 (2013.01)

(58) Field of Classification Search
CPC ........... H01L 29/7848; H01L 29/66492; H01L 29/785; H01L 21/047; H01L 21/76802; H01L 21/02164; H01L 21/26586; H01L 29/165
See application file for complete search history.

SEMICONDUCTOR STRUCTURE WITH BARRIER LAYERS

CROSS-REFERENCES TO RELATED APPLICATIONS

This application is a divisional of U.S. patent application Ser. No. 15/862,569, filed on Jan. 4, 2018, which claims the priority of Chinese patent application No. 201710011110.1, filed on Jan. 6, 2017, the entirety of which is incorporated herein by reference.

FIELD OF THE DISCLOSURE

The present disclosure generally relates to the field of semiconductor manufacturing technologies and, more particularly, relates to semiconductor structures.

BACKGROUND

With the continuous increase of the integration level of the semiconductor devices, the critical dimensions (CDs) of transistors have been continuously reduced. Reducing the CDs of the transistors means more and more transistors can be disposed in one chip; and the performance of the chip is enhanced. However, with the continuous decrease of the area of the chip, more challenges occur. With rapid size reduction of the transistor, the thickness of the dummy gate dielectric layer and the operation voltage are unable to change accordingly. Thus, it is more difficult to reduce the short channel effect. Accordingly, the leakage current in the channel of the device is increased.

To reduce the short channel effect of the semiconductor device, ultra shallow junction (USJ) technology has been developed. However, the USJ technology is easy to cause the transistor to have a junction capacitance issue and a junction leakage issue in drain region, especially for the source/drain regions of the NMOS device where precise control of the implantation parameters are needed.

The existing semiconductor structures have a large short channel effect. The disclosed methods and semiconductor structures are directed to solve one or more problems set forth above and other problems in the art.

BRIEF SUMMARY OF THE DISCLOSURE

One aspect of the present disclosure includes a fabrication method of a semiconductor structure. The method includes providing a base substrate; forming a dummy gate structure over the base substrate; forming source/drain regions having source/drain doping ions in the base substrate at both sides of the dummy gate structure; forming a dielectric layer on the source/drain regions and covering the side surfaces of the dummy gate structure; removing the dummy gate structure to form an opening in the dielectric layer; performing one or more of a first ion implantation process, for implanting first barrier ions in the base substrate toward the source region to form a first barrier layer under the opening, and a second ion implantation process, for implanting second barrier ions in the base substrate toward the source region to form a second barrier layer under the opening; and forming a gate structure in the opening.

Another aspect of the present disclosure includes a semiconductor structure. The semiconductor structure includes a base substrate; a gate structure over the base substrate; source/drain regions having source/drain doping ions in the base substrate at both sides of the gate structure; one or more of a first barrier layer adjacent to the source region and having first barrier ions, and a second barrier layer adjacent to the drain region and having second barrier ions in the base substrate; and a dielectric layer on the source/drain regions and covering side surfaces of the gate structure.

Other aspects of the present disclosure can be understood by those skilled in the art in light of the description, the claims, and the drawings of the present disclosure.

DETAILED DESCRIPTION

Figure 1:
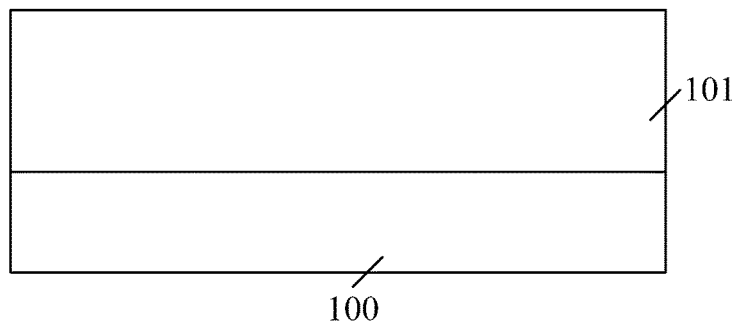
FIGS. 1-10 illustrate structures corresponding to certain stages during an exemplary fabrication process of a semiconductor structure consistent with various disclosed embodiments.

Reference will now be made in detail to exemplary embodiments of the disclosure, which are illustrated in the accompanying drawings. Wherever possible, the same reference numbers will be used throughout the drawings to refer to the same or like parts.

The present disclosure provides technical solutions to the problems in conventional semiconductor structures including the short channel effect.

Fabricating a semiconductor structure may include: providing a semiconductor substrate; forming a gate structure on the surface of the semiconductor substrate; forming halo regions having halo ions in the semiconductor substrate by performing an ion implantation process using the gate structure as a mask; forming sidewall spacers on the side surfaces of the gate structure; and forming doped source/drain regions having source/drain doping ions in the semiconductor substrate at two sides of the gate structure.

By performing the ion implantation process on the semiconductor substrate at two sides of the gate structure, the halo regions are formed in the semiconductor substrate at two sides of the gate structure. The doping type of the barrier ions in the halo regions may be opposite to the doping type of the source/drain doping ions in the doped source/drain regions. When the source/drain doping ions diffuse into the channel region of the transistor, they are easy to recombine with the barrier ions in the halo regions. Thus, the halo regions are able to prevent the source/drain doping ions from diffusing into the channel region of the transistor; and the short channel effect of the semiconductor structure may be reduced.

However, the halo regions are adjacent to the channel regions of the transistor. If the concentration of the barrier ions in the halo region is too large, or the thickness of the halo region is too big, the concentration of the ions from the halo region and doped into the channel region is relatively large. Accordingly, the threshold voltage of the transistor is increased. Thus, the thickness of the halo regions is relatively small; and the concentration of the barrier ions in the halo regions is relatively low.

Because the thickness of the halo regions is relatively small, and the concentration of the barrier ions in the halo regions is relatively low, the barrier function of the halo regions to the diffusion of the source/drain doping ions is relatively small. Thus, the effect of the halo regions to reduce the short channel effect is limited. Thus, the semiconductor structure still has the relatively large leakage current issue.

The present disclosure provides a semiconductor structure and a fabrication method thereof. The method may include providing a semiconductor substrate; forming a dummy gate structure on the semiconductor substrate; forming a source region having source doping ions and a drain region having drain doping ions at two sides of the dummy gate structure, respectively; forming a dielectric layer covering the side surfaces of the dummy gate structure on the source/drain region; removing the dummy gate structure to form an opening in the dielectric layer; performing a first ion implantation process and/or a second ion implantation process on the semiconductor substrate on the bottom of the opening; and forming a gate structure in the opening. The implanting direction of the first implantation process may be toward the source region to implant first barrier ions in the semiconductor substrate on the bottom of the opening to form a first barrier layer. The implanting direction of the second implantation process may be toward the drain region to implant second barrier ions in the semiconductor substrate on the bottom of the opening to form a second barrier layer.

When the first ion implantation process is performed to form the first barrier layer in the semiconductor substrate on the bottom of the opening, the first barrier ions may be able to enter the interstitial sites of the atoms of the semiconductor substrate. Thus, the diffusion of the source/drain doping ions in the source region to the portion of the semiconductor substrate under the gate structure may be reduced; and the short channel effect may be reduced. When the second ion implantation process is performed to form the second barrier layer in the semiconductor substrate on the bottom of the opening, the second barrier ions may be able to enter the interstitial sites of the atoms of the semiconductor substrate. Thus, the diffusion of the source/drain doping ions in the drain region to the portion of the semiconductor substrate under the gate structure may be reduced; and the short channel effect may be reduced.

Further, the conductive type of the first barrier ions and the second barrier ions may be opposite to the conductive type of the source/drain doping ions. Thus, during the process for the source/drain doping ions to diffuse into the semiconductor substrate under the gate structure, the first barrier ions; and the second barrier ions may be able to recombine with the source/drain doping ions to prevent the source/drain doping ions from diffusing into the semiconductor substrate under the gate structure. Accordingly, the short channel effect may be reduced.

Further, the first barrier layer may be formed by the first ion implantation process. Because the source region may often be connected to ground, the potential may be substantially low; and the electrical field between the source region and the first barrier layer may be substantially weak. Thus, the first barrier layer may not increase the leakage current in the drain region.

Figure 10:
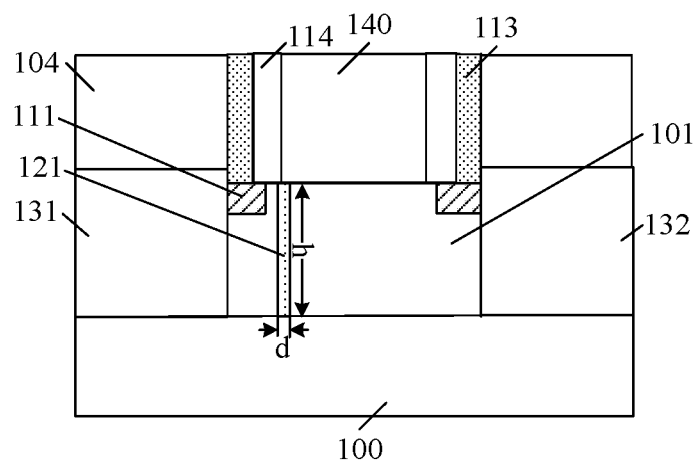
Figure 11:
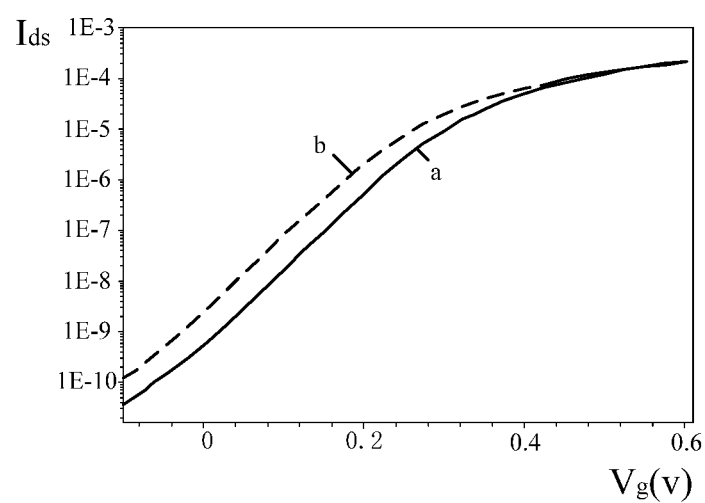
FIG. 11 illustrates correlations between the leakage current and the gate voltage of a disclosed semiconductor structure and a semiconductor structure without a first barrier layer and a second barrier layer.
Figure 12:
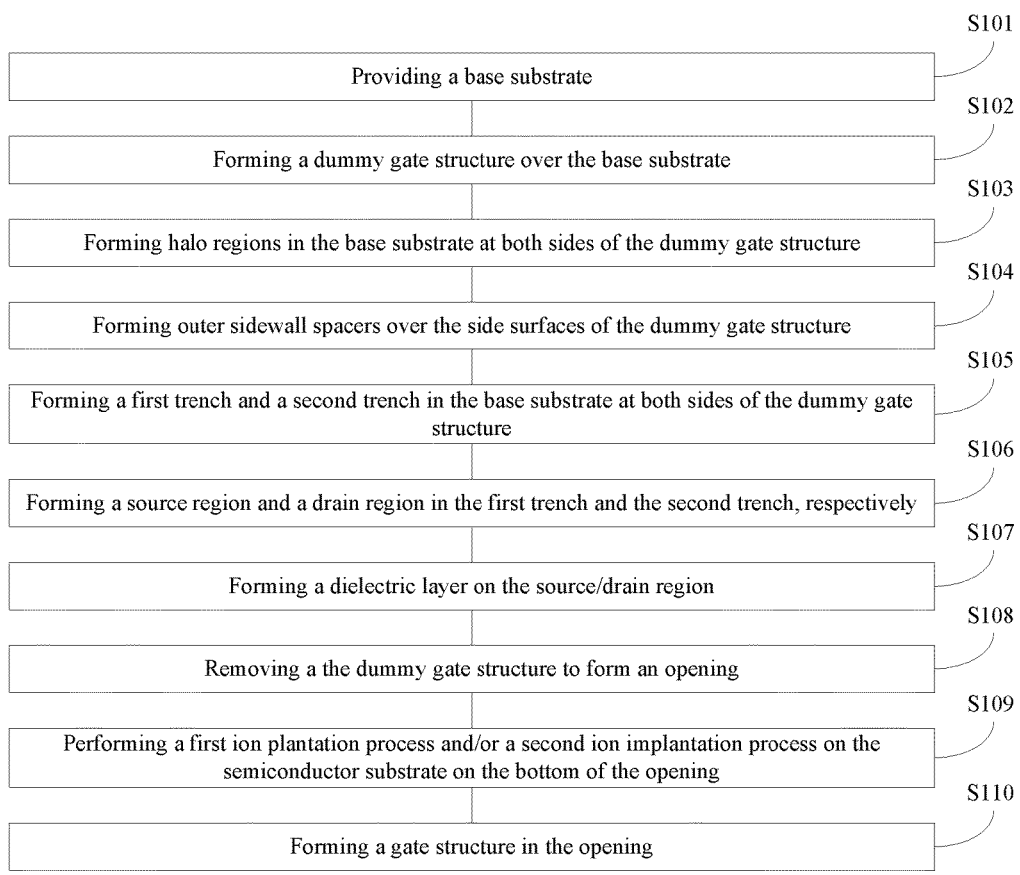
FIG. 12 illustrates an exemplary fabrication process of a semiconductor structure consistent with various disclosed embodiments.

FIG. 12 illustrates an exemplary fabrication method of a semiconductor structure consistent with various disclosed embodiments. FIGS. 1-11 illustrate semiconductor structures corresponding to certain stages during the exemplary fabrication method.

As shown in FIG. 12, at the beginning of the fabrication process, a base substrate is provided (S101). FIG. 1 illustrates a corresponding semiconductor structure.

As shown in FIG. 1, a base substrate is provided. The base substrate provides a process platform for fabricating the semiconductor structure.

In one embodiment, the base substrate may be used to form NMOS transistors. In some embodiments, the base substrate may be used to form PMOS transistors.

In one embodiment, the base substrate may include a semiconductor substrate 100 and at least one fin 101 on the semiconductor substrate 100. In some embodiments, the base substrate may be a planar substrate. The planar substrate may be a silicon substrate, a germanium substrate, a silicon germanium substrate, or a silicon on insulator (SOI) substrate, etc.

In one embodiment, the base substrate is a silicon substrate. The silicon substrate may have a <110>, <100>, or other appropriate orientation.

Figure 2:
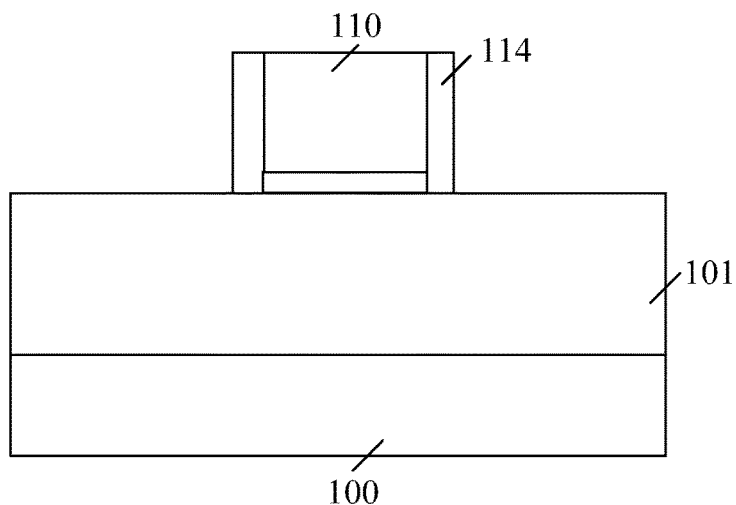

Returning to FIG. 12, after providing the base substrate, a dummy gate structure may be formed over the base substrate (S102). FIG. 2 illustrates a corresponding semiconductor structure.

As shown in FIG. 2, a dummy gate structure 110 is formed over the base substrate. The portion of the base substrate under the gate structure 110 may be used to form the channel region of a transistor.

In one embodiment, the dummy gate structure 110 may be across the fin 101. The dummy gate structure 110 may be on portions of the top and side surfaces of the fin 101.

In one embodiment, the dummy gate structure 110 may include a dummy gate dielectric layer (not labeled) across the fin 101 and on the portions of side and top surfaces of the fin 101; and a dummy gate electrode (not labeled) on the dummy gate dielectric layer.

In one embodiment, before forming the dummy gate structure 110, an ion implantation process may be performed on the fin 101 to implant well ions to form well regions (not shown).

In one embodiment, the semiconductor structure may be an N-type transistor. The well ions may be P-type ions, such as B ions, or $BF^{2-}$ ions, etc. In some embodiments, the semiconductor structure may be a P-type transistor. The well ions may be N-type ions, such as P ions, or As ions, etc.

In one embodiment, after forming the dummy gate structure 110, inner sidewall spacers 114 may be formed on the side surfaces of the dummy gate electrode and the side surfaces of the dummy gate dielectric layer.

The inner sidewall spacers 114 may be used as a mask for the subsequent halo region ion implantation process so as to prevent the subsequently formed halo regions to be close to the channel region.

Figure 3:
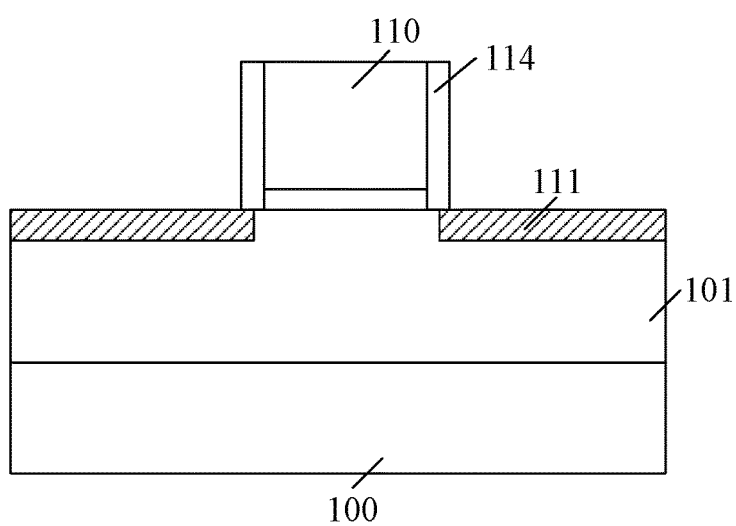

Returning to FIG. 12, after forming the dummy gate structure, halo regions may be formed (S103). FIG. 3 illustrates a corresponding semiconductor structure.

As shown in FIG. 3, halo regions 111 are formed in the base substrate at two sides of the dummy gate structure 110. The halo regions 111 may be used to subsequently prevent the source/drain doping ions from diffusing into the portion of the base substrate under the dummy gate structure 110.

In one embodiment, the process for forming the halo regions 111 may include implanting halo region ions into the portions of the base substrate at two sides of the dummy gate structure 110 by a halo region ion implantation process using the dummy gate structure 110 and the inner sidewall spacers 114 as a mask.

In one embodiment, the halo regions 111 may be in the fin 101 at two sides of the dummy gate structure 110.

In one embodiment, the halo region ions are P-type ions, such as B ions, or $BF^{2-}$ ions, etc. In some embodiments, the semiconductor structure is a PMOS transistor, the halo region ions may be N-type ions, such as P ions, or As ions, etc.

After forming the halo regions 111, lightly doped drain (LDD) regions (not shown) may be formed in the base substrate at two sides of the dummy gate structure 110 by a lightly doped ion implantation process.

The LDD regions may be used to reduce the resistance between the subsequently formed source region and the base substrate, and the resistance between the subsequently formed drain region and the base substrate.

The conductive type of the lightly doping ions may be different from the conductive type of the halo region ions. For example, in one embodiment, the semiconductor structure is an NMOS transistor, the lightly doped ions may be N-type ions, such as P ions, or As ions. In some embodiments, the halo region ions may be N-type ions, and the lightly doping ions may be P-type ions.

Figure 4:
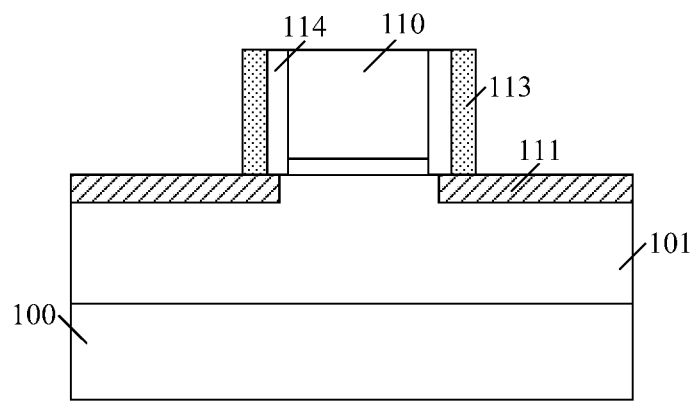

Returning to FIG. 12, after forming the halo regions, outer sidewall spacers may be formed (S104). FIG. 4 illustrates a corresponding semiconductor structure.

As shown in FIG. 4, outer sidewall spacers 113 are formed on side surfaces of the inner sidewall spacers 114.

The outer sidewall spacers 113 may be used as the mask for subsequently forming a source/drain region to avoid the distance between the source/drain regions being substantially small. Accordingly, the short channel effect may be reduced. Further, the outer sidewall spacers 113 may also be used to generate a shadow effect during the subsequent first ion implantation process. The shadow effect may be able to prevent the distance between the first barrier layer formed by the first ion implantation process and the channel region from being substantially small. Thus, the effect of the first barrier layer to the threshold voltage of the formed transistor may be reduced.

In one embodiment, the process for forming the outer sidewall spacers 113 may include forming a sidewall spacer material layer on the top surface of the dummy gate structure 110, the side surfaces of the inner sidewall spacers 114 and the halo regions 111; and etching back the sidewall spacer material layer to remove the portions of the sidewall spacer material layer on the top surface of the dummy gate structure 110 and the halo regions 111. Thus, the outer sidewall spacers 113 may be formed.

In one embodiment, the outer sidewall spacers 113 are made of silicon nitride. In some embodiments, the outer sidewall spacers may be made of silicon oxide, or silicon oxynitride, etc.

The sidewall spacer material layer may be formed by any appropriate process. In one embodiment, a chemical vapor deposition (CVD) process is used to form the sidewall spacer material layer.

Various processes may be used to etch back the sidewall spacer material layer. In one embodiment, an anisotropic dry etching process is used to etch the sidewall spacer material layer. The vertical etching rate of the anisotropic drying process may be greater than the lateral etching rate of the anisotropic dry etching process. Thus, the portions of the sidewall spacer material on the side surfaces of the dummy gate structure 110 may not be easily removed.

In some embodiments, the halo regions may be omitted.

Source/drain regions may be subsequently formed in the base substrate at two sides of the dummy gate structure 110. The source/drain regions may be doped with doping ions.

Figure 5:
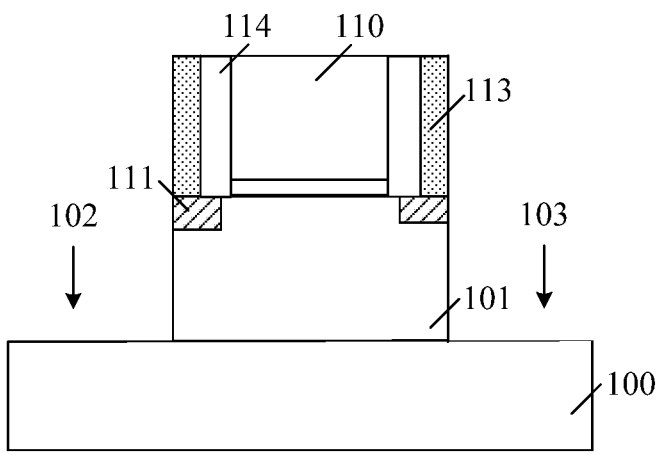

Returning to FIG. 12, after forming the outer sidewall spacers, a first trench and a second trench may be formed (S105). FIG. 5 illustrates a corresponding semiconductor structure.

As shown in FIG. 5, a first trench 102 and a second trench 103 are formed in the base substrate at two sides of the dummy gate structure 110, respectively. A source region may be subsequently formed in the first trench 102; and a drain region may be subsequently formed in the second trench 103.

The first trench 102 and the second trench 103 may be formed by any appropriate process. In one embodiment, a combination of a dry etching process and a wet etching process is used to form the first trench 102 and the second trench 103. In some embodiments, a dry etching process, or a wet etching process may be used to form the first trench or the second trench.

In one embodiment, the first trench 102 and the second trench 103 may be in the fin 101 at two sides of the dummy gate structure 110.

In one embodiment, the depth of the first trench 102 may be the same as the depth of the second trench 103; and may be in a range of approximately 30 nm-70 nm.

In one embodiment, the process for forming the first trench 102 and the second trench 103 may include etching the fin 101 using the dummy gate structure 110, the inner sidewall spacers 114 and the outer sidewall spacers 113 as an etching mask.

Figure 6:
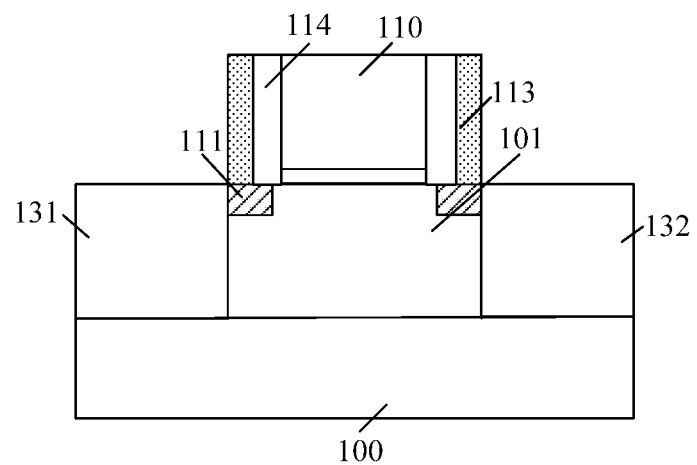

Returning to FIG. 12, after forming the first trench and the second trench, source/drain regions may be formed (S106). FIG. 6 illustrates a corresponding semiconductor structure.

As shown in FIG. 6, a source region 131 is formed in the first trench 102. Further, a drain region 132 may be formed in the second trench 103.

The process for forming the source region 131 and the drain region 132 may include forming a stress layer in the first trench 102 and the second trench 103 by an epitaxial growth process. During the epitaxial growth process, the stress layer may be in situ doped with source/drain doping ions. Thus, the source region 131 may be formed in the first trench 102; and the drain region 132 may be formed in the second trench 103. In some embodiments, the source/drain regions may be formed by performing an ion implantation process to the stress layer.

In one embodiment, the stress layer may be used to form the source region 131 and the drain region 132 of an NMOS transistor. Thus, the stress layer may be made of silicon carbide. The crystal lattice of silicon carbide may be smaller than the crystal lattice of the fin 101. Thus, the stress layer may be able to provide a tensile stress to the portion of the base substrate under the dummy gate structure 110. Accordingly, the carrier mobility of the channel region may be increased; and the performance of the semiconductor structure may be improved.

In some embodiments, the stress layer may be used to form the source/drain regions of a PMOS transistor. Thus, the stress layer may be made of silicon germanium.

Specifically, in one embodiment, the source region 131 and the drain region 132 are made of silicon carbide having source/drain doping ions, i.e., doped with the source/drain doping ions. In some embodiments, the doped source/drain regions may be made of silicon germanium having source/drain doping ions.

In one embodiment, the source region 131 and the drain region 132 are used to form an NNOS transistor. Thus, the source/drain doping ions may be P ions, or As ions, etc. In some embodiments, the source/drain regions may be used to form a PMOS transistor. Thus, the source/drain doping ions may be P-type ions, such as B ions, or $BF^{2-}$ ions, etc.

In one embodiment, the thickness of the source region 131 may be in a range of approximately 30 nm-70 nm. The thickness of the drain region 132 may be in a range of approximately 30 nm-70 nm. As used herein, the thickness of the source region 131 refers to as the size of the source region 131 along a direction perpendicular to the semiconductor substrate 100; and the thickness of the drain region 132 refers to as the size of the drain region 132 along a direction perpendicular to the semiconductor substrate 100.

Figure 7:
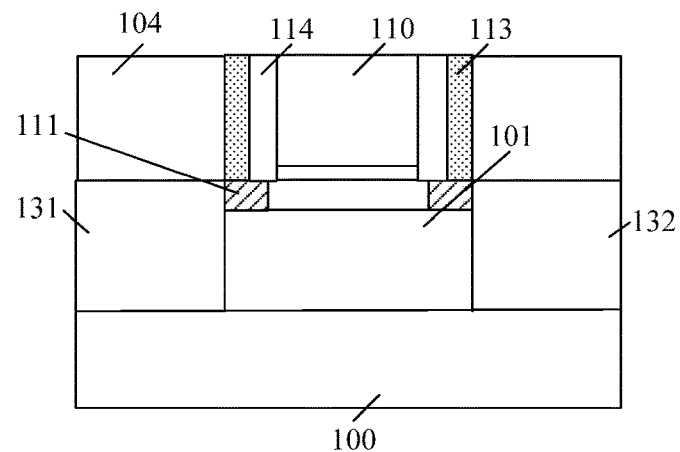

Returning to FIG. 12, after forming the source/drain regions, a dielectric layer may be formed (S107). FIG. 7 illustrates a corresponding semiconductor structure.

As shown in FIG. 7, a dielectric layer 104 is formed on the source region 131 and the drain region 132. The dielectric layer 104 may cover the side surfaces of the dummy gate structure 110.

The dielectric layer 104 may be used to protect the source region 131 and the drain region 132 during a subsequent first ion implantation process to prevent first barrier ions from diffusing into the source region 131 and the drain region 132.

In one embodiment, the process for forming the dielectric layer 104 may include forming an initial dielectric layer on the source region 131 and the drain region 132 to cover the side and the top surfaces of the dummy gate structure 110; and performing a planarization process on the initial dielectric layer to remove the portion of the initial dielectric layer on the dummy gate structure 110.

The initial dielectric layer may be formed by any appropriate process. In one embodiment, the initial interlayer dielectric layer is formed by a CVD process.

The planarization process may be any appropriate process. In one embodiment, the planarization process is a chemical mechanical polishing (CMP) process.

In one embodiment, the dielectric layer 104 is made of silicon oxide. In some embodiments, the dielectric layer may be made of silicon oxynitride, etc.

Figure 8:
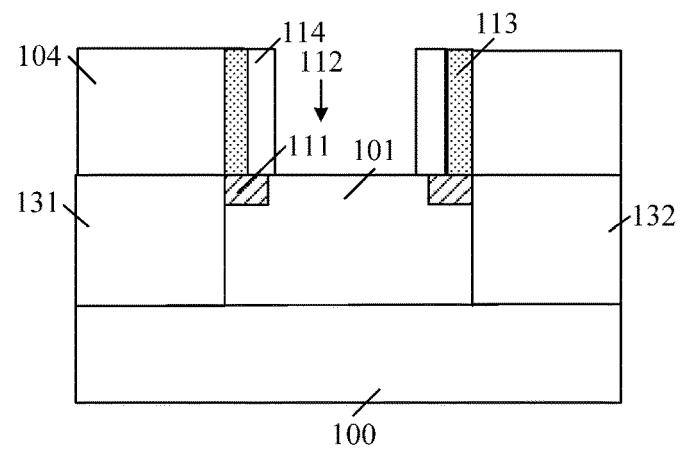

Returning to FIG. 12, after forming the dielectric layer, the dummy gate structure may be removed (S108). FIG. 8 illustrates a corresponding semiconductor structure.

As shown in FIG. 8, the dummy gate structure 110 (referring to FIG. 7) is removed; and an opening 112 is formed. The opening 112 may be used to subsequently form a gate structure.

In one embodiment, the dummy gate structure 110 is removed by a dry etching process. In some embodiments, the dummy gate structure may be removed by a wet etching process, etc.

Figure 9:
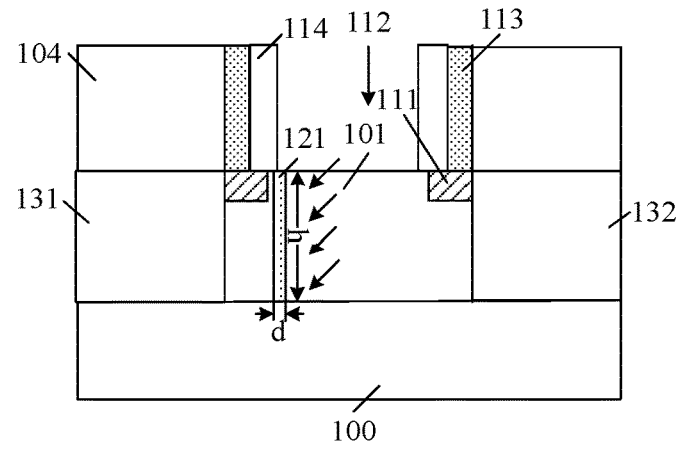

Returning to FIG. 12, after forming the opening, a first ion implantation process and/or a second ion implantation process may be performed (S109). FIG. 9 illustrates a corresponding semiconductor structure.

As shown in FIG. 9, a first ion implantation process and/or a second ion implantation process may be performed on the base substrate on the bottom of the opening 112. That is, one or both of a first ion implantation process and a second ion implantation process may be performed on the base substrate on the bottom of the opening 112.

The implanting direction of the first ion implantation process may be toward the source region 131; and first barrier ions may be implanted into the base substrate on the bottom of the opening 112 to form a first barrier layer 121. The implanting direction of the second ion implantation process may be toward the drain region 132; and second barrier ions may be implanted into the base substrate on the bottom of the opening 112 to form a second barrier layer (not shown).

When the first ion implantation process is performed to form the first barrier layer 121 in the base substrate under the bottom of the opening 112, the first barrier ions may enter into interstitial sites of the atoms of the base substrate. The diffusion of the source/drain doping ions in the source region 131 into the base substrate on the bottom of the opening 112 may be reduced. Thus, the first barrier layer 121 may be able to prevent the source/drain doping ions in the source region 131 from diffusing into the base substrate on the bottom of the opening 112. Accordingly, the short channel effect may be reduced.

When the second ion implantation process is performed to form the second barrier layer in the base substrate under the bottom of the opening 112, the second barrier ions may enter into interstitial sites of the atoms of the base substrate. The diffusion of the source/drain doping ions in the drain region 132 into the base substrate under the bottom of the opening 112 may be reduced. Thus, the second barrier layer may be able to prevent the source/drain doping ions in the drain region 132 from diffusing into the base substrate under the bottom of the opening 112. Thus, the short channel effect may be reduced.

In one embodiment, only the first ion implantation process is performed on the base substrate under the bottom of the opening 112; and second ion implantation process may not be performed. That is, only the first barrier layer 112 may be formed; and the second barrier layer may not be formed.

In one embodiment, the first barrier ions may include electronegative ions and/or electroneutral ions. The first barrier ions may be able to enter into the interstitial sites of the atoms of the base substrate. Thus, the paths for the source/drain doping ions to diffuse into the base substrate under the bottom of the opening 112 may be reduced. Therefore, the first barrier layer 121 may be able to prevent the source/drain doping ions in the source region 131 from diffusing into the base substrate under the bottom of the opening 112. Accordingly, the short channel effect may be reduced.

Further, the conductive type of the electronegative ions may be opposite to the conductive type of the source/drain doping ions. During the process for the source/drain doping ions diffusing into the base substrate under the bottom of the first opening 112, the first doping ions and the second doping ion may recombine with the source/drain doping ions. Thus, the diffusion of the source/doping ions to the base substrate under the bottom of the opening 112 may be prevented; and the short channel effect may be further reduced.

In some embodiments, the first barrier ions may not include electroneutral ions, or may only include electroneutral ions.

In one embodiment, the electroneutral ions may include carbon ions, germanium ions, or silicon ions, etc. The electronegative ions may include nitrogen ions, etc. In one embodiment, the first barrier ions may include both the electroneutral ion and the electronegative ions. For example, the carbon ions and the nitrogen ions may be used together as the first barrier ions.

The conductive type of the electronegative ions may be opposite to the conductive type of the source/drain doping ions. In one embodiment, the source/drain doping ions are N-type ions, thus the electronegative ions may be P-type ions, such as B ions, or $BF^{2-}$ ions, etc. In some embodiments, the source/drain doping ions may be P-type ions; and the electronegative ions may be N-type ions.

In one embodiment, only the first ion implantation process is performed. The source region 131 is often connected to ground; and the potential of the source region 131 may be substantially low; and the electrical field between the source region 131 and the first barrier layer 121 may be substantially weak. Thus, performing the first ion implantation process may not increase the leakage current of the source region 131.

In one embodiment, the implanting angle of the first ion implantation process may be in a range of approximately 15°-45°. The dosage of the first ion implantation process may be in a range of approximately $1E12/cm^2$-$1E14/cm^2$. The energy of the first ion implantation process may be in a range of 1.0 KeV-2.5 KeV.

The implanting angle of the first ion implantation process refers to as the acute angle between the direction of the ion beam of the first ion implantation process and the normal of the surface of the semiconductor substrate 100. The direction of the ion beam of the first ion implantation process may be toward the source region 131. In some embodiments, a second ion implantation process may also be performed.

The size of the first barrier layer 121 along a direction perpendicular to the surface of the semiconductor substrate 100 may be referred to as the height "h" of the first barrier layer 121. The height "h" of the first barrier layer 121 may be greater than, smaller than, or equal to the thickness of the source region 131.

If the height "h" of the first barrier layer 121 is too small, the barrier function of the first barrier layer 121 to the source/drain doping ions may be reduced. If the height "h" of the first barrier layer 121 is too large, it may waste energy and material. The height "h" of the first barrier layer 121 may be greater than the thickness of the halo regions. In one embodiment, the height "h" of the first barrier layer 121 may be substantially equal to the thickness of the source region 131. Specifically, the thickness of the first barrier layer 121 may be in a range of approximately 30 nm-70 nm.

The height "h" of the first barrier layer 121 may be sufficiently large; and may be able to prevent the source/drain doping ions from diffusing into the channel region of the transistor through the base substrate under the halo regions. Thus, the short channel effect may be reduced.

In one embodiment, during the first ion implantation process, because of the shadow effect of the outer sidewall spacers 113, the inner sidewall spacers 114 and the dielectric layer 104, it may be uneasy to implant the first barrier ions into the fin 101 adjacent to the drain region 132. Thus, the leakage current of the drain region 132 may be reduced.

The width "d" of the first barrier layer 121 may refers to as the size of the first barrier layer 121 along a direction perpendicular to the length direction of the opening 112 and parallel to the surface of the base substrate. If the width "d" of the first barrier layer 121 is too large, the threshold voltage of the formed transistor may be affected. If the width "d" of the first barrier layer 121 is too small, the barrier effect to the source/drain doping ions may be too small; and the short channel effect may not be easy to reduce. In one embodiment, the width "d" of the first barrier layer 121 may be in a range of approximately 2 nm-6 nm.

In some embodiment, a second ion implantation process may be performed to form a second barrier layer. The size of the second barrier layer may be substantially the same as the size of the first barrier layer 121. The process parameters of the second ion implantation process may be substantially the same as the process parameters of the first ion implantation process.

Returning to FIG. 12, after performing the first ion implantation process and/or the second ion implantation process, a gate structure may be formed (S110). FIG. 10 illustrates a corresponding semiconductor structure.

As shown in FIG. 10, a gate structure 140 is formed in the opening 112 (as shown in FIG. 9). In one embodiment, the gate structure 140 may include a gate dielectric layer (not labeled) on the bottom of the opening 112 and a gate dielectric layer on the surface of the gate dielectric layer (not labeled).

The gate dielectric layer may be made of a high-K dielectric material, such as $HfO_2$, $La_2O_3$, HfSiON, $HfAlO_2$, $ZrO_2$, $Al_2O_3$, or $HfSiO_4$, etc.

In one embodiment, the gate electrode layer is made of metal, such as Al, Cu, Ag, Au, Ni, Ti, W, WN, or WSi, etc.

FIG. 11 illustrates correlations between the source/drain current $I_{ds}$ and the gate voltage $V_g$ of a disclose semiconductor structure and a semiconductor structure without a first barrier layer and a second barrier layer.

As shown in FIG. 11, the abscissa denotes the gate voltage $V_g$; and the ordinate denotes the source/drain current $I_{ds}$. The curve "a" illustrates the correlation between the source/drain current $I_{ds}$ and the gate voltage $V_g$ of a disclosed semiconductor structure; and the curve "b" illustrates the correlation between the source/drain current $I_{ds}$ and the gate voltage $V_g$ of a semiconductor structure without a first barrier layer and a second barrier layer.

As shown in FIG. 11, when the gate voltage $V_g$ is substantially small, the source/drain current $I_{ds}$ of the disclosed semiconductor structure is smaller than the source/drain current $I_{ds}$ of the semiconductor structure without a first barrier and a second barrier layer. Thus, when the semiconductor structures are at an "off" status, the source/drain current $I_{ds}$ of the disclosed semiconductor structure may be substantially small. That is, the leakage current of the disclosed semiconductor structure may be substantially small. Thus, the disclosed method for forming a semiconductor structure may be able to reduce the leakage current; and the short channel effect may be reduced.

Thus, in the disclosed fabrication method of the semiconductor structure, a first ion implantation process and/or a second ion implantation process may be performed on the base substrate on the bottom of the opening. When the first ion implantation process is performed to form a first barrier layer in the base substrate, the first barrier ions may be able to enter the interstitial sites of the base substrate. Thus, the diffusion of the source/drain ions into the base substrate under the gate structure may be reduced; and the short channel effect may be reduced.

When the second ion implantation process is performed to form a second barrier layer in the base substrate, the second barrier ions may be able to enter the interstitial sites of the atoms of the base substrate. Thus, the diffusion of the source/drain ions into the base substrate under the gate structure may be reduced; and the short channel effect may be reduced.

Further, the conductive type of the barrier ions and the second barrier ions may be opposite to the conductive type of the source/drain doping ions. Thus, during the process for the source/drain doping ions to diffuse into the base substrate under the gate structure, the first barrier ions and the second barrier ions may recombine with the source/drain doping ions. Accordingly, the diffusion of the source/drain doping ion into the base substrate under the gate structure may be prevented; and the short channel effect may be reduced.

Further, the first barrier layer may be formed by the first ion implantation process. Because the source region may be often connected to ground, the potential is relatively low; and the electrical field between the source region and the first barrier layer may be relatively weak. Thus, the first barrier may not easily increase the leakage current of the source region.

The present disclosure also provides a semiconductor structure. FIG. 10 illustrates a corresponding semiconductor structure consistent with various disclosed embodiments.

As shown in FIG. 10, the semiconductor structure may include a base substrate and a gate structure 140 on the base substrate. The semiconductor structure may also include a source region 131 having source/drain doping ions and a drain region 132 having source/drain doping ions in the base substrate at two sides of the gate structure 140, respectively. Further, the semiconductor structure may also include one or more of a first barrier layer 121 and a second barrier layer (not shown) in the base substrate under the gate structure 140. The first barrier 121 may be adjacent to the source region 131, and may have first barrier ions. The second barrier layer may be adjacent to the drain region 132; and may have second barrier ions. Further, the semiconductor structure may also include a dielectric layer 104 on the source region 131 and the drain region 104 and covering the side surfaces of the gate structure 140. The detailed structures and intermediate structures are described above with respect to the fabrication processes.

In one embodiment, the base substrate provides a process platform for forming the semiconductor structure.

In one embodiment, the base substrate may be used to form an NMOS transistor. In some embodiments, the base substrate may be used to form a PMOS transistor.

In one embodiment, the base substrate may include a semiconductor substrate 100 and a fin 101 on the semiconductor substrate 100. In some embodiments, the base substrate may be a planar substrate. Specifically, the planar substrate may be a germanium substrate, a silicon substrate, a silicon germanium substrate, or a silicon on insulator (SOI) substrate, etc.

In one embodiment, the base substrate is a silicon substrate. The silicon substrate may have a <110>, <100>, or other appropriate orientation.

In one embodiment, the semiconductor structure may also include a well region (not shown). The well region may have well ions.

In one embodiment, the semiconductor structure is an NMOS transistor. The well ions may be P-type ions, such as B ions, or $BF^{2-}$ ions, etc. In some embodiments, the semiconductor structure may be a PMOS transistor. The well ions may be N-type ions, such as P ions, or As ions, etc.

In one embodiment, the gate structure 140 may include a gate dielectric layer on the bottom of the opening 112; and a gate electrode on the gate dielectric layer.

The gate dielectric layer may be made of a high-K dielectric material, such as $HfO_2$, $La_2O_3$, HfSiON, $HfAlO_2$, $ZrO_2$, $Al_2O_3$, or $HfSiO_4$, etc.

In one embodiment, the gate electrode may be made of a metal material, such as Al, Cu, Ag, Au, Ni, Ti, W, WN, or WSi, etc.

In one embodiment, the semiconductor structure may also include halo regions 111 in the base substrate at two sides of the gate structure 140. The halo regions 111 may have halo ions. The conductive type of the halo ions may be opposite to the conductive type of the source/drain doping ions. In some embodiments, the halo regions may be omitted.

The halo regions 111 may be used to prevent the source/drain doping ions from diffusing into the base substrate under the gate structure 140.

In one embodiment, the semiconductor structure may also include inner sidewall spacers 114 on the side surfaces of the gate dielectric layer and the gate electrode. The inner sidewall spacers 114 may prevent the halo regions 111 from being too close to the channel region.

The halo regions 111 may be in the base substrate at two sides of the inner sidewall spacers 114.

In one embodiment, the halo regions 111 may be in the fin 101 at two sides of the gate structure 140.

In one embodiment, the ions in the halo region 111 are P-type ions, such as B ions, or $BF^{2-}$ ions, etc. In some embodiments, the semiconductor structure may be PMOS transistor, the ions in the halo regions may by N-type ions, such as P ions, or As ions, etc.

In one embodiment, the semiconductor structure may also include outer sidewall spacers 113 on the side surfaces of the inner sidewall spacers 114. The outer sidewall spacers 113 may be used to prevent the first barrier layer 121 from being too close to the channel region. Thus, the effect of the first barrier layer 121 to the threshold voltage of the transistor may be reduced.

In one embodiment, the outer sidewall spacers 113 are made of silicon nitride. In some embodiments, the outer sidewall spacers may be made of silicon oxide, or silicon oxynitride, etc.

In one embodiment, the source region 131 and the drain region 132 are made of silicon carbide doped with source/drain doping ions. The crystal lattice of the silicon carbide may be smaller than the crystal lattice of the fin 101. Thus, the source region 131 and the drain region 132 may be able to provide a tensile stress to the base substrate under the gate structure 140; and the carrier mobility of the channel region may be increased. Accordingly, the performance of the semiconductor structure may be improved. In some embodiments, the source/drain regions may be made of silicon germanium doped with source/drain doping ions.

In one embodiment, the source region 131 and the drain region 132 are used to form an NMOS transistor, the source/drain doping ions may be N-type ions, such as P ions, or As ions, etc. In some embodiments, the source/drain doping regions may be used to form a PMOS transistor, the source/drain doping ions may be P-type ions, such as B ions, or $BF^{2-}$, etc.

In one embodiment, the thickness of the source region 131 may be in a range of approximately 30 nm-70 nm; and the thickness of the drain region 132 may be in a range of approximately 30 nm-70 nm. As used herein, the thickness of the source regions 131 refers to as the size of the source region 131 along the direction perpendicular to the surface of the semiconductor substrate 100; and the thickness of the drain region 132 refers to as the size of the drain region 132 along the direction perpendicular to the surface of the semiconductor substrate 100.

When the first barrier layer 121 is formed in the base substrate under the bottom of the opening 112, the first barrier ions may be able to enter the interstitial sites of the atoms of the base substrate, the paths for the source/drain doping ions to diffuse into the portion of the base substrate under the gate structure 140 may be reduced. Thus, the first barrier layer 121 may be able to prevent the source/drain doping ions in the source region 131 from diffusing into the base substrate under the gate structure 140; and the short channel effect may be reduced.

When the second barrier layer is formed in the base substrate on the bottom of the opening 112, the second barrier ions may be able to enter the interstitial sites of the atoms of the base substrate, the paths for the source/drain doping ions to diffuse into the portion of the base substrate under the gate structure 140 may be reduced. Thus, the second barrier layer may be able to prevent the source/drain doping ions in the drain region 132 from diffusing into the base substrate under the gate structure 140; and the short channel effect may be reduced.

In one embodiment, only the first barrier layer 131 is formed in the base substrate under the bottom of the of the opening 112; and the second barrier layer may be omitted.

In one embodiment, the first barrier ions may include electronegative ions and electroneutral ions. The first barrier ions may be able to enter into the interstitial sites of the atoms of the base substrate. Thus, the paths for the source/drain doping ions to diffuse into the base substrate under the bottom of the opening 112 may be reduced. Therefore, the first barrier layer 121 may be able to prevent the source/drain doping ions in the source region 131 from diffusing into the base substrate under the bottom of the opening 112. Accordingly, the short channel effect may be reduced.

Further, the conductive type of the electronegative ions may be opposite to the conductive type of the source/drain doping ions. During the process for the source/drain doping ions to diffuse into the base substrate under the bottom of the first opening 112, the first doping ions and the second doping ions may recombine with the source/drain doping ions. Thus, the diffusion of the source/doping ions into the base substrate under the bottom of the opening 112 may be prevented; and the short channel effect may be further reduced.

In some embodiments, the first barrier ions may not include the electroneutral ions; or may only include the electroneutral ions.

In one embodiment, the electroneutral ions include carbon ions, germanium ions, or silicon ions, etc. The electronegative ions may include nitrogen ions, etc.

The conductive type of the electronegative ions may be opposite to the conductive type of the source/drain doping ions. In one embodiment, the source/drain doping ions are N-type ions, thus the electronegative ions may be P-type ions, such as B ions, or $BF^{2-}$ ions, etc. In some embodiments, the source/drain doping ions are P-type ions; and the electronegative ions are N-type ions.

In one embodiment, the source region 131 is often connected to ground; and the potential of the source region 131 may be substantially low, the electrical field between the source region 131 and the first barrier layer 121 may be substantially weak. Thus, the process for forming the first barrier layer 121, e.g., the first ion implantation process, may not increase the leakage current of the source region 131.

The size of the first barrier layer 121 along a direction perpendicular to the surface of the semiconductor substrate 100 may be referred to as the height "h" of the first barrier layer 121. The height "h" of the first barrier layer 121 may be greater than, smaller than, or equal to the thickness of the source region 131.

If the height "h" of the first barrier layer 121 is too small, the barrier function of the first barrier layer 121 to the source/drain doping ions may be reduced. If the height "h" of the first barrier layer 121 is too large, it may waste energy and material. The height "h" of the first barrier layer 121 may be greater than the thickness of the halo regions. In one embodiment, the height "h" of the first barrier layer 121 may be substantially equal to the thickness of the source region 131. Specifically, the thickness of the first barrier layer 121 may be in a range of approximately 30 nm-70 nm.

The height "h" of the first barrier layer 121 may be sufficiently large; and may be able to prevent the source/drain doping ions from diffusing into the channel region of the transistor through the base substrate under the halo regions. Thus, the short channel effect may be effectively reduced.

The width "d" of the first barrier layer 121 may refer to as the size of the first barrier layer 121 along a direction perpendicular to the length direction of the opening 112 and parallel to the surface of the base substrate. If the width "d" of the first barrier layer 121 is too large, the threshold voltage of the formed transistor may be affected. If the width "d" of the first barrier layer 121 is too small, the barrier effect to the source/drain doping ions may be too small; and the short channel effect may not be easy to reduce. In one embodiment, the width "d" of the first barrier layer 121 may be in a range of approximately 2 nm-6 nm.

In one embodiment, the concentration of the first barrier ions in the first barrier layer 121 is in a range of approximately $1E12$ atoms/cm$^2$-$1E13$ atoms/cm$^2$.

In one embodiment, the dielectric layer 104 is made of silicon oxide. In some embodiments, the dielectric layer may be made of silicon oxynitride, etc.

Thus, in the disclosed semiconductor structure, a first barrier layer and/or a second barrier layer may be formed in the base substrate under the bottom of the opening. When the first barrier layer is doped with first barrier ions, the first barrier ions may be able to enter the interstitial sites of the atoms of the base substrate, the paths for the source/drain doping ions to diffuse into the portion of the base substrate under the gate structure may be reduced. Thus, the first barrier layer may be able to prevent the source/drain doping ions in the source region from diffusing into the base substrate under the gate structure; and the short channel effect may be reduced.

When the second barrier layer is doped with second barrier ions, the second barrier ions may be able to enter the interstitial sites of the atoms of the base substrate, the paths for the source/drain doping ions to diffuse into the portion of the base substrate under the gate structure may be reduced. Thus, the second barrier layer may be able to prevent the source/drain doping ions in the drain region from diffusing into the base substrate under the gate structure 140; and the short channel effect may be reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a base substrate;
   a gate structure over the base substrate;
   source/drain regions having source/drain doping ions in the base substrate at both sides of the gate structure;
   one or more of a first barrier layer adjacent to the source region and having first barrier ions, and a second barrier layer adjacent to the drain region and having second barrier ions in the base substrate, wherein the first barrier layer and the second barrier layer are isolated from the source/drain regions; and
   a dielectric layer on the source/drain regions and covering side surfaces of the gate structure.

2. The semiconductor structure according to claim 1, wherein:
a height of the first barrier layer is in a range of approximately 30 nm-70 nm; and
a width of the first barrier layer is in a range of approximately 2 nm-6 nm.

3. The semiconductor structure according to claim 1, wherein:
a height of the first barrier layer and the second barrier layer is substantially the same as a thickness of the source/drain regions.

4. The semiconductor structure according to claim 1, wherein:
a concentration of doping ions in the first barrier layer and the second barrier layer is in a range of approximately 1E12atoms/cm$^2$-1E13atoms/cm$^2$.

5. The semiconductor structure according to claim 1, wherein the first barrier ions and the second barrier ions comprises:
one or more electronegative ions with a conductive type opposite to a conductive type of the source/drain doping ions, and electroneutral ions.

6. The semiconductor structure according to claim 5, wherein:
the electronegative ions include one of P ions, B ions, and BF$^{2-}$ ions.

7. The semiconductor structure according to claim 1, wherein:
the first barrier ions and the second barrier ions include one or more of N ions, C ions and Si ions.

8. The semiconductor structure according to claim 2, wherein:
the source/drain regions are made of silicon germanium, silicon carbide, or a combination thereof.

9. The semiconductor structure according to claim 8, wherein:
the silicon germanium is doped with source/drain doping ions including one of B ions and BF$^{2-}$ ions; and
the silicon carbide is doped with source/drain doping ions including one of P ions and As ions.

10. The semiconductor structure according to claim 1, wherein:
the base substrate is a silicon substrate.

11. The semiconductor structure according to claim 1, wherein:
a thickness of the source/drain regions is in a range of approximately 20 nm-70 nm.

12. A semiconductor structure, comprising:
a base substrate;
a gate structure over the base substrate;
source/drain regions having source/drain doping ions in the base substrate at both sides of the gate structure;
one or more of a first barrier layer adjacent to the source region and having first barrier ions, and a second barrier layer adjacent to the drain region and having second barrier ions in the base substrate;
a dielectric layer on the source/drain regions and covering side surfaces of the gate structure;
outer sidewall spacers on side surfaces of the gate structure; and
halo regions in the base substrate under the outer sidewall spacers,
wherein the halo regions have halo region ions with a conductive type opposite to a conductive type of the source/drain doping ions.

13. The semiconductor structure according to claim 12, wherein:
a distance between the halo region and the gate structure is smaller than a distance between the source region and the gate structure.

14. The semiconductor structure according to claim 12, wherein:
a height of the first barrier layer is in a range of approximately 30 nm-70 nm; and
a width of the first barrier layer is in a range of approximately 2 nm-6 nm.

15. The semiconductor structure according to claim 12, wherein:
a height of the first barrier layer and the second barrier layer is substantially the same as a thickness of the source/drain regions.

16. The semiconductor structure according to claim 12, wherein:
a concentration of doping ions in the first barrier layer and the second barrier layer is in a range of approximately 1E12atoms/cm$^2$-1E13atoms/cm$^2$.

17. The semiconductor structure according to claim 12, wherein the first barrier ions and the second barrier ions comprises:
one or more electronegative ions with a conductive type opposite to a conductive type of the source/drain doping ions, and electroneutral ions.

18. The semiconductor structure according to claim 17, wherein:
the electronegative ions include one of P ions, B ions, and BF$^{2-}$ ions.

19. The semiconductor structure according to claim 12, wherein:
the first barrier ions and the second barrier ions include one or more of N ions, C ions and Si ions.

20. The semiconductor structure according to claim 14, wherein:
the source/drain regions are made of silicon germanium, silicon carbide, or a combination thereof.

* * * * *